(12) United States Patent
Lacombe et al.

(10) Patent No.: US 12,199,606 B2
(45) Date of Patent: Jan. 14, 2025

(54) LEVEL SHIFTER WITH EXPANDED VOLTAGE RANGE

(71) Applicant: MACOM Technology Solutions Holdings, Inc., Lowell, MA (US)

(72) Inventors: David Kenneth Lacombe, Lowell, MA (US); Kai Kwan, Lowell, MA (US); Quazi Ikram, Lowell, MA (US); Cristiano Bazzani, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 57 days.

(21) Appl. No.: 18/198,275

(22) Filed: May 16, 2023

(65) Prior Publication Data

US 2024/0388292 A1 Nov. 21, 2024

(51) Int. Cl.
*H03K 19/0185* (2006.01)
(52) U.S. Cl.
CPC ............... *H03K 19/018521* (2013.01)
(58) Field of Classification Search
CPC .................................... H03K 19/018521
USPC ........................................... 327/333
See application file for complete search history.

(56) References Cited

U.S. PATENT DOCUMENTS

| | | | |
|---|---|---|---|
| 6,323,704 B1 * | 11/2001 | Pelley | H03K 19/00315 327/333 |
| 6,700,407 B1 * | 3/2004 | Wert | H03K 3/356113 326/62 |
| 7,505,498 B2 | 3/2009 | Sanchez | |
| 7,737,668 B2 | 6/2010 | Oswald et al. | |
| 7,768,353 B2 | 8/2010 | Chang et al. | |
| 7,936,197 B2 | 5/2011 | Keady et al. | |
| 7,949,025 B2 | 5/2011 | Olea | |
| 9,515,628 B2 | 12/2016 | Zhou et al. | |
| 9,853,735 B1 | 12/2017 | Lin | |
| 2003/0165168 A1 | 9/2003 | Murata | |
| 2004/0188717 A1 | 9/2004 | Ono | |
| 2006/0098699 A1 | 5/2006 | Sanchez | |
| 2006/0126683 A1 | 6/2006 | Kang | |
| 2006/0153256 A1 | 7/2006 | Sanchez | |
| 2006/0165139 A1 | 7/2006 | Sanchez | |
| 2009/0238226 A1 | 9/2009 | Moto et al. | |

* cited by examiner

*Primary Examiner* — Tomi Skibinski
(74) *Attorney, Agent, or Firm* — Weide & Miller, Ltd.

(57) ABSTRACT

A level shifter, configured to shift an input voltage swing from a first voltage range to a second voltage range, comprising a first stage and a switching stage, with circuitry configured in isolation wells. The first stage includes a first stage input receiving an input signal that swings between a first voltage value and a second voltage, a buffer configured to shift the input signal to vary between a third value and a fourth value, and a first stage output configured to present a first stage output signal. The switching stage comprises switching stage inputs, configured to receive the first stage output signal, switch drivers, and switching devices configured to, responsive to the driver output, generate a switching stage output signal that is a shifted version of the input signal. The switching stage output signal ranges between a fifth voltage value and a sixth voltage value.

20 Claims, 3 Drawing Sheets

LEVEL SHIFTER WITH EXPANDED VOLTAGE RANGE

1. FIELD OF THE INVENTION

The invention relates to level shifters and in particular to integrate level shifters with a floating input voltage and output voltage.

2. RELATED ART

Modern electronics circuits and systems may operate in a mixed voltage environment such that different elements may operate within different voltage ranges, or the interface between systems may be at different voltage levels. Level shifters are used to accommodate these differences. In digital electronics, a level shifter, also called logic-level shifter or voltage level translator, is a circuit used to translate signals from one logic level or voltage domain to another, allowing compatibility between integrated circuits with different voltage requirements. In digital circuits, logic levels define the differences between a high level signal, representing a digital 1, and a low level signal, representing a digital 0. There are a variety of different logic states, and this is typically based on a voltage level in reference to ground or zero volts. The range of each voltage level can vary, and it depends on the logic family or process. Thus, the level shifter is a helpful tool to connect two different digital circuits with different logic levels.

In the prior art, level shifters, particularly for high voltages (>5V) are implemented external to the integrated circuit using a network, array or resistor dividers and is referenced to a particular voltage. However, these prior art level shifters suffered from several drawbacks. One such drawback arose from the off-chip implementation which required significant space and a high component count, leading to a costly implementation. In addition, these prior art approaches suffered from high power consumption.

Another drawback to the prior art is speed constraints. The interface between components may be configured as a serial interface with a clock and a chip select. The interface has a clock rate which is limited by the prior art. When the level shifter is configured with external components, outside of the chip, operation at higher speeds, such as for example 50 MHz, is difficult, expensive to implement, or not possible.

To overcome the drawbacks of the prior art and provide additional benefits, an improved level shifter and associated method of operation is disclosed.

SUMMARY

To overcome the drawbacks of the prior art and provide additional benefits, disclosed is level shifter configured to accept an input voltage that can float between a switching stage positive supply voltage and a switching stage negative supply voltage thereby allowing a large input voltage range. In this embodiment, the level shifter comprises a first stage and a switching stage. The first stage comprises a first stage input configured to receive an input signal, such that the input signal can float between the positive switching stage supply voltage and a negative switching stage supply voltage, and the input signal voltage swing can swing between a first stage positive supply voltage and a first stage negative supply voltage. Also part of a first stage is a buffer configured to shift the input signal to vary between the positive first stage supply voltage and a negative first stage supply voltage to create a buffer output. A first stage output is configured to present the buffer output as a first stage output signal.

The switching stage comprises a first switching device and a second switching device. The first switching device is configured to process the first stage output signal to generate a high level output signal. The high level output signal ranges between the switching stage positive supply voltage and the switching stage positive supply voltage minus 5 volts. The second switching device is configured to process the first stage output signal to generate a low level output signal. The low level output signal ranges between the switching stage negative supply voltage and the switching stage negative supply voltage plus 5 volts.

In one embodiment, the switching stage positive supply voltage comprises $V_{CC}$ and the switching stage negative supply voltage comprises $V_{EE}$. This system may further comprise one or more switch drivers configured to receive the first stage output signal and generate one or more driver outputs configured to drive one or more switching devices. In one configuration the first stage positive supply voltage is $V_C$ and the first stage negative supply voltage is $V_E$ and the difference between $V_C$ and $V_E$ may be 5 volts. It is contemplated that the switching stage negative supply voltage is $V_{EE}$ which is between -54 volts and 0 volts, and the switching stage positive supply voltage is $V_{CC}$ which is between 6 volts and 60 volts.

In one embodiment, the first switching device comprises a PMOS FET and a second switching device comprises a NMOS FET. The level shifter may further comprise a non-overlap module configured to prevent the first switching device and a second switching device from being on at the same time. It is contemplated that the one or more switching devices may be located in isolation wells, and the isolation wells may be formed by Pwells and Nwells.

Also disclosed is a level shifter configured to accept an input voltage that can float between a $V_{CC}$ voltage and a $V_{EE}$ voltage thereby allowing a large input voltage range. In this embodiment, the level shifter comprises a buffer stage and a switching stage. The buffer stage comprises a buffer stage input configured to receive an input signal. The input signal can float or vary between the $V_{CC}$ voltage and the $V_{EE}$ voltage, and the input signal can swing between a $V_C$ voltage and a $V_E$ voltage. Also part of the buffer stage is a buffer configured to shift a voltage of the input signal upward or downward, to create a buffer output, and a buffer stage output configured to present the buffer output as a first stage output signal. A switching stage comprises a first switching device configured to process the first stage output signal to generate a high level output signal. The high level output signal ranges between the $V_{CC}$ voltage and the $V_{CC}$ voltage minus 5 volts. A second switching device configured to process the first stage output signal to generate a low level output signal, the low level output signal ranging between $V_{EE}$ voltage and $V_{EE}$ voltage plus 5 volts.

In one embodiment, the level shifter further comprises one or more switch drivers configured to receive the first stage output signal and generate one or more driver outputs configured to drive one or more switching devices.

The first switching device may comprise a PMOS FET and a second switching device may comprise a NMOS FET. The level shifter may further comprise a non-overlap module configured to prevent the first switching device and a second switching device from being on at the same time. In one configuration, the one or more switching devices are in isolation wells, and the isolation wells may be formed by Pwells and Nwells.

Also disclosed is a method for level shifting an input signal comprising receiving an input signal at a buffer stage such that the received input signal can be between a switching stage positive supply voltage and a switching stage negative supply voltage. Then, shifting the input signal voltage, such that the input signal can swing between a buffer stage positive supply voltage and a buffer stage negative supply voltage, to create a buffer stage output signal. Thereafter, outputting the buffer stage output signal to a switching stage. The switching stage processes the buffer stage output signal to generate a high level output signal. The high level output signal may range between $V_{CC}$ and $V_{CC}$ minus 5 volts. In one embodiment, $V_{CC}$ is 60 volts. The switching stage also processes the buffer stage output signal to generate a low level output signal. The low level output signal may range between $V_{EE}$ and $V_{EE}$ plus 5 volts. In one embodiment $V_{EE}$ is -54 volts.

In this method of operation, the switching stage negative supply voltage may be $V_{EE}$ which is between -54 volts and 0 volts, and the switching stage positive supply voltage may be $V_{CC}$ which is between 6 volts and 60 volts.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

To overcome the drawbacks of the prior art and provide additional benefits, disclosed is an improved level shifter that can be fully integrated, and which allows the input values to float between a wide range of input voltages as selected by a user or circuit designer. This provides higher speed operation, lower complexity, reduced space and power requirements, as well as being less costly to manufacture. As an overview, the innovation is a level shifter that can accept input signals between the supplies $V_{CC}$ and $V_{EE}$. The input signal range is set by the $V_C$ and $V_E$ supplies, where the supply difference $V_C$-$V_E$ is ~5V, and the $V_C$-$V_E$ supplies can float between $V_{CC}$-1V and $V_{EE}$. The $V_{CC}$-$V_{EE}$ supply can be as large as 60V, and range of the supplies can be $V_{CC}$=60V and $V_{EE}$=0V, and $V_{CC}$=6V and $V_{EE}$=-54V. By having this floating input range, a wide variety of external input signals can be used.

Figure 1:
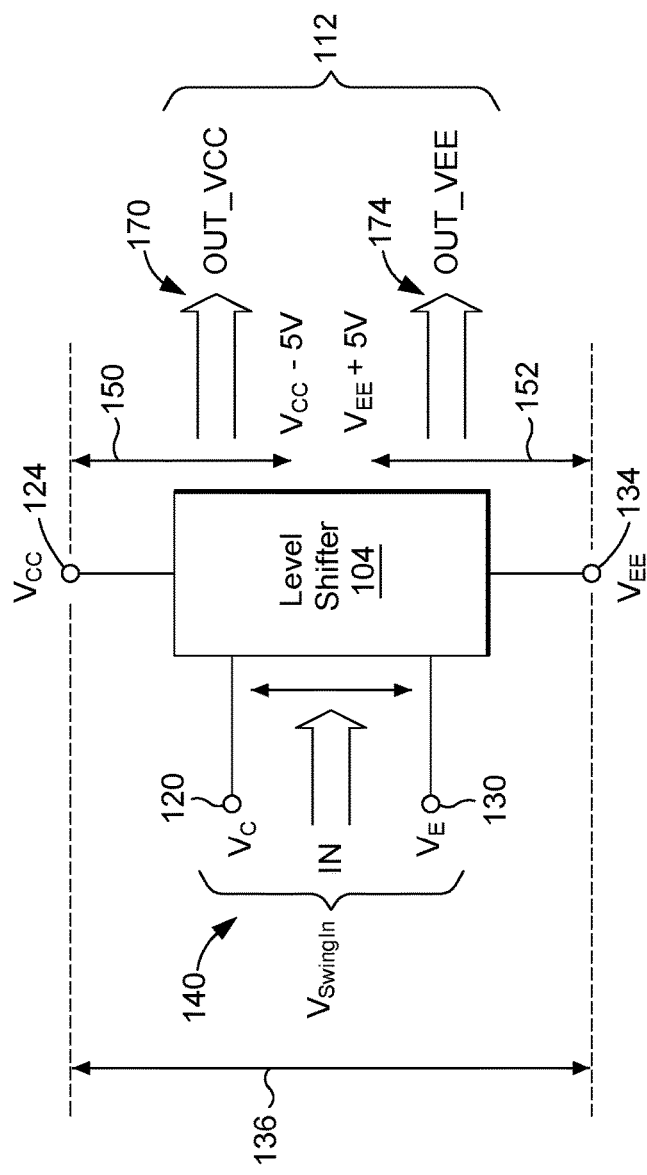
FIG. 1 illustrates a high level block diagram of a level shifter consistent with the level shifter disclosed herein.

FIG. 1 illustrates an exemplary level shifter according to one embodiment of the innovation. In this embodiment, a level shifter 104 is represented generally with understanding that numerous types of circuits and elements may be arranged to function as described herein. The level shifter 104 includes an input 120, 130 and an output 112. The level shifter 104 also has an input side voltage supply that includes positive supply voltage nodes $V_C$ 120 and node $V_{CC}$ 124, as well as negative supply voltage node $V_E$ 130 and $V_{EE}$ node 134.

The input signals toggle between the $V_C$ and $V_E$ supplies. The $V_C$ and $V_E$ voltage difference is ~5V however in other embodiments, the difference between $V_C$ and $V_E$ may be other than 5 volts. The arrows 136 illustrate the ability of the input 120, 130 to be floated upward or downward between $V_E$ and $V_C$, which are the positive and negative supply voltages based on the values selected for $V_E$ and $V_C$. The $V_C$ and $V_E$ supplies can "float" between the $V_{CC}$ and $V_{EE}$ supplies. For example: (1) $V_C$=5V, $V_E$=0V, $V_{CC}$=60V, $V_{EE}$=0V; (2) $V_C$=59V, $V_E$=54V, $V_{CC}$=60V, $V_{EE}$=0V; (3) $V_C$=-49V, $V_E$=-54V, $V_{CC}$=6V, $V_{EE}$=-54V. The input signal levels follow the $V_C$ and $V_E$ supplies. The positive and negative supply voltages may be set at any value such that there is a differential between them that relates to the difference between a logic 0 value and a logic 1 value. In one embodiment $V_E$ is set to 0 volts and $V_C$ is set to 5 volts. However, in another embodiment, the value of the $V_E$ can be -54 volts while the value of $V_C$ can be -49 volts. In other embodiments the values of $V_E$ and $V_C$ can be other values. Stated another way, the $V_C$ and $V_E$ supplies float between $V_{CC}$ and $V_{EE}$ supplies and that the input signals toggle between the $V_C$ and $V_E$ supplies.

The input signal 120, 130 may swing or vary over time by an amount defined as $V_{SwingIn}$ 140 which is the voltage swing of the input signal over time, such as between a logic 0 level and a logic 1 level. The $V_{SwingIn}$ input signal can swing $V_E$ and $V_C$, and $V_C$ and $V_E$ can float between $V_{CC}$ and $V_{EE}$. In one embodiment the $V_{SwingIn}$ is 5 volts such that there is a 5 volts difference between the $V_E$ 130 and $V_C$ 120. In other embodiments, the $V_{SwingIn}$ 140 may be a different voltage swing than 5 volts. As a result, during operation the $V_{SwingIn}$ can be shifted upward or downward, as set by $V_E$ and $V_C$, with the constraint that the input voltage swing or variance can range between $V_E$ and $V_C$ and $V_C$ and $V_E$ can float between $V_{CC}$ and $V_{EE}$.

The level shifter also includes an output side that has output side supply voltages. The output side supply voltages include a negative output supply voltage node $V_{EE}$ 134 and a positive output supply voltage node $V_{CC}$ 124. As occurs on the input side, there is an output signal 112 which is comprised of a $V_{CCout}$ 170 and a $V_{EEout}$ 174. The $V_{CC}$ and $V_{EE}$ supplies can float and the output signals toggle with respect to the $V_{CC}$ and $V_{EE}$ supplies. The arrows 150, 152 designate that the output signals $V_{CCout}$, $V_{EEout}$ range and may be shifted upward or downward based on the values selected for $V_{EE}$ and $V_{CC}$. The range or swing of the $V_{CCout}$ is $V_{CC}$ minus 5 volts. The range or swing of the $V_{EEout}$ is $V_{EE}$ plus 5 volts. In other embodiments, the value added or subtracted may be different. In one embodiment, the value of $V_{EE}$ is -54 volts and the value of $V_{CC}$ is +6 volts. In other embodiments the values of $V_E$, $V_C$, $V_{EE}$, and $V_{CC}$ may be set at different values. Thus, there are two level shifter outputs 170, 174. One output ranges or swings between $V_{CC}$ and $V_{CC}$ minus 5V (in FIG. 3, bias source 340 provides $V_{CC}$-5 voltage bias), and another output ranges or swings between $V_{EE}$ and $V_{EE}$ plus 5V (in FIG. 3, bias source 344 provides $V_{EE}$+5V voltage bias).

The logic level of the output tracks the input but is level shifted. For example, if the input signal swings between 0 volts and 5 volts, and if $V_E$ and $V_C$ are set to 6 volts and 11 volts respectively, then the $V_{SwingIn}$ is 5 volts which is 11 volts minus 6 volts. The input voltage is shifted upward at the output by the level shifter circuit 104. At the output, the output signal will have a voltage that toggles with respect to the $V_{CC}$ and $V_{EE}$ supplies and the $V_{CC}$ and $V_{EE}$ supplies float. Thus, the input supplies are floating, and the $V_C$ and $V_E$ supplies can float between $V_{CC}$ and $V_{EE}$ or vice versa. The input signals toggle between the $V_C$ and $V_E$ supplies, and the output signals switch between $V_{CC}$ and $V_{CC}$–5V and between $V_{EE}$ and $V_{EE}$+5V. In other embodiments, the voltage values can be in any range subject to the maximum well breakdown voltages as discussed below and which can change depending on process and technology.

Figure 2:
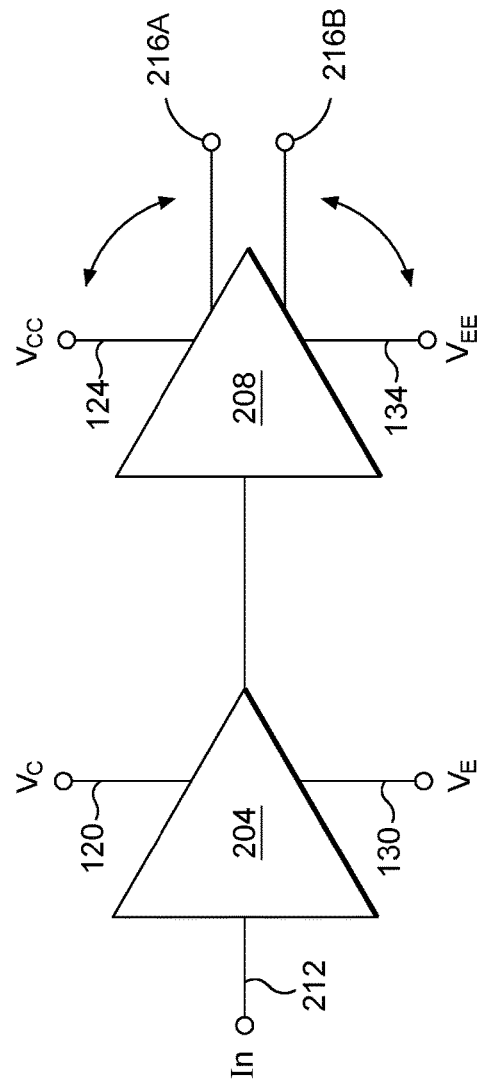
FIG. 2 illustrates a simplified circuit diagram of a level shifter according to FIG. 1.

FIG. 2 illustrates a circuit diagram of a level shifter using two digital buffer stages. This is but one possible configuration and is provided primarily to aid in understanding. As shown, a first stage buffer 204 is in series with a second stage buffer 208. The first stage buffer 204 comprises a digital buffer with an input 212 configured to receive an input signal. The first stage buffer 204 includes a positive supply voltage node 120 at a voltage $V_C$ and a negative supply voltage node 130 at a voltage $V_E$. The output of the first stage buffer 204 connects to the second stage buffer 208. The second stage buffer 208 includes a positive supply voltage node 124 at a voltage $V_{CC}$ and a negative supply voltage node 134 at a voltage $V_{EE}$. The second stage buffer presents level shifted signals on outputs 216A, 216B as outputs. The output 216A can range from $V_{CC}$ to $V_{CC}$ minus 5 volts. The output 216B can range from $V_{EE}$ to $V_{EE}$ plus 5 volts. The level shifter shown in FIG. 2 functions with similar capability as discussed above for FIG. 1.

By setting the value of $V_E$ and $V_C$ for the first digital buffer 204, the input signal voltage may float up or down in magnitude, while still varying within the $V_{SwingIn}$ range. A typical input voltage swing on the input 212 may be 5 volts. The maximum and minimum values that the input signal may swing between are set by $V_E$ and $V_C$. This may best be illustrated numerically. In one example embodiment, if $V_E$ were 18 volts and $V_C$ were 23 volts, then the input signal which may vary between 0 and 5 volts (5 volt swing), would float over the same 5 volt range on the output of the first digital buffer 204 between 18 volts and 23 volts. In one embodiment, the value of $V_C$ minus $V_E$ should be 5 volts or less although in other embodiments, other values may be established. In this embodiment, $V_C$ and $V_E$ are set between $V_{CC}$ and $V_{EE}$ with the additional requirement that $V_C$ and $V_E$ are less than or equal to 5V, and furthermore, $V_C$ should be 1 volt below $V_{CC}$ to provide sufficient headroom.

Turning to operation of the second stage digital buffer 208, the output of the first buffer stage 204 is presented to the input of the second stage 208 as the input signal. The second stage is biased between voltage $V_{EE}$ 134 and $V_{CC}$ 124. The first stage 204 increases the voltage level of the input signal on input 212 to a voltage capable of controlling the second stage buffer 208, such as the gate of a switching transistor in the second stage buffer as discussed below in greater detail. For example, the difference between the second stage buffer input voltage and the values of $V_{EE}$ and $V_{CC}$ cannot be too large or a semiconductor device junction breakdown may occur. This is discussed below in greater detail.

Figure 3:
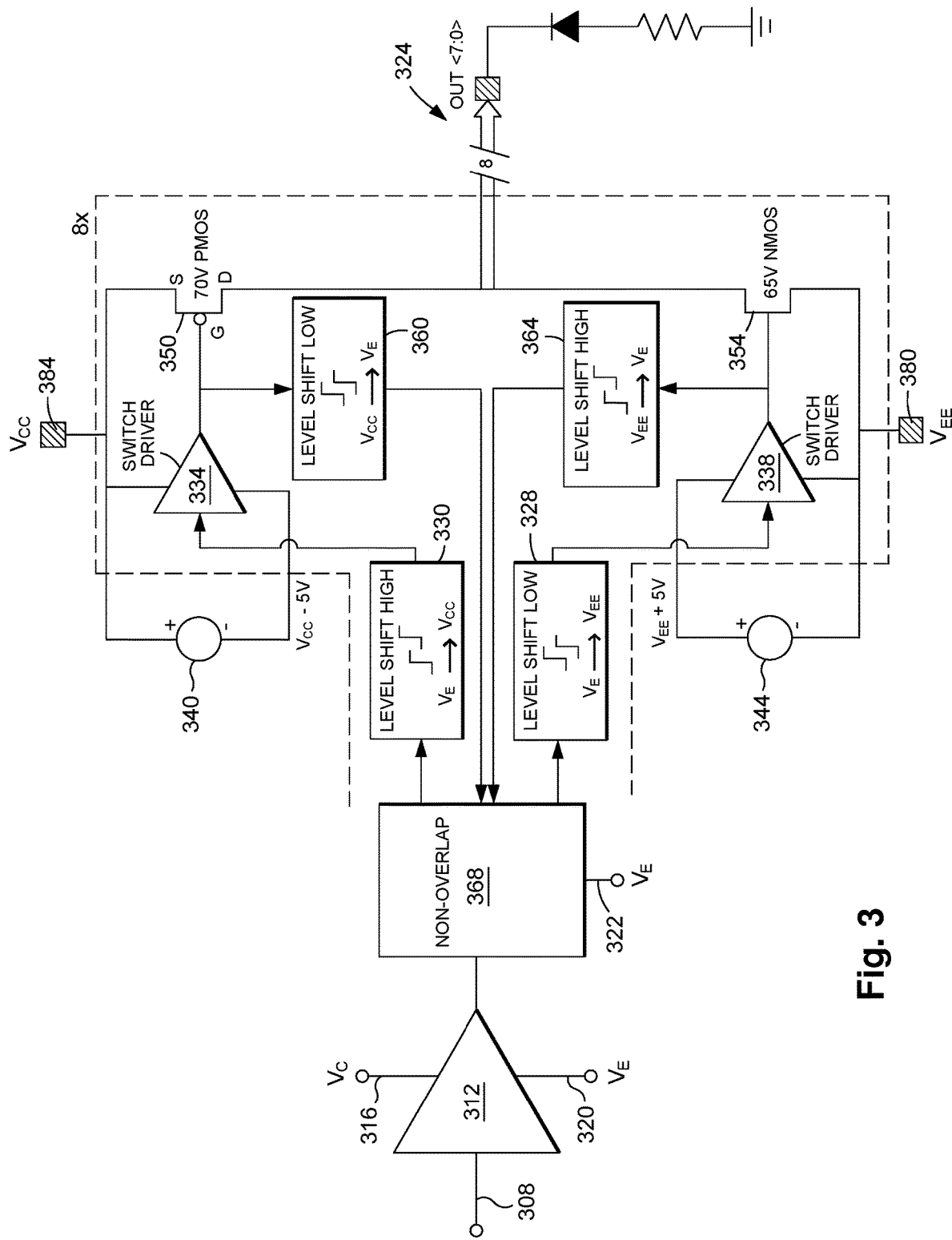
FIG. 3 illustrates a level shifting system with high voltage drivers.

FIG. 3 illustrates a level shifting system configured for use with high voltage drivers. This provides one example environment of use of the level shifting innovation disclosed herein. In this embodiment, a first stage buffer 312 includes a first stage input 308 which is configured to receive an input signal for processing to shift the voltage level of the input signal. The first stage buffer 312 has a negative supply voltage $V_E$ 320 and a positive supply voltage $V_C$ 316. In one embodiment, the first stage buffer 312 is configured to shift the input signal upward or downward, without altering the voltage swing or changing in the input voltage over time other than the shift or offset the magnitude upward or downward.

The output of the first stage buffer 312 connects to a non-overlap module 368. The non-overlap module 368 comprises logic or other circuitry that is configured to ensure that the PMOS switch 350 and the NMOS switch 354 do not turn on simultaneously. A feedback signal, discussed below, functions as a control input to the non-overlap module 368 to facilitate operation. The outputs of the non-overlap circuit are level shifted from $V_C$ to $V_{CC}$ for the PMOS switch driver 334, and from $V_E$ to $V_{EE}$ for the NMOS switch driver 338. The non-overlap circuit detects when the PMOS switch is OFF and delays when the NMOS switch turns ON. The opposite detection also occurs for the NMOS switch OFF and PMOS switch ON transitions.

The overlap module 368 provides an input to a level shift high unit 330 and a level shift low unit 328. The level shift units 330, 328 shift the voltage of the signals to a level suitable for driving the gates of the PMOS switch 350 and the NMOS switch 354. The level shift may range from the value of $V_{EE}$ to $V_{CC}$, which are provided at the $V_{EE}$ node 380 and the $V_{CC}$ node 384. In particular, the level shift unit 330 can shift the output signals from the level shift high unit 330 to the value set by $V_{CC}$ or close to $V_{CC}$ such that a voltage $V_{GS}$ is at a value which avoids junction breakdown between the gate terminal and the source terminal of the PMOS device 350. In this embodiment, the voltage $V_{CC}$ may range from 6 volts to 60 volts. Similarly, the level shift low unit 328 shifts the signal low level to the value set by $V_{EE}$ or close to $V_{EE}$ such that a voltage $V_{GS}$ is at a value which avoids junction breakdown between the gate terminal and the source terminal of the NMOS device 354. In this embodiment, $V_{EE}$ may range from –54 volts to 0 volts. The voltage $V_{EE}$ may also be referred to as the negative output supply voltage and the voltage $V_{CC}$ may be referred to as the positive output supply voltage.

The output of the level shift high unit 330 connects to a switch driver 334 while the output of the level shift low unit 328 connects to a switch driver 338. The switch drivers 334, 338 are configured to drive the gates of the PMOS high signal level switch (PMOS device) 350 and the NMOS low signal level switch (NMOS device) 354. The switch drivers 334, 338 functions as a buffer capable of driving a large capacitance that is seen at the gate of the PMOS and NMOS devices 350, 354. A biasing unit 340, 344 bias the switch drivers as is understood in the art.

The switches 350, 354 are controlled by the output of the switch drivers 334, 338. The high level signal is output by the high signal level switch 350 as an input to the gate terminal of the PMOS switch 350. The high level signal is set by voltage $V_{CC}$ presented on $V_{CC}$ node 384. The low level signal is output by the low signal level switch 354 and the low level output voltage is set by the voltage $V_{EE}$ presented on $V_{EE}$ node 380. An output 324 provides the output signal at the new voltage level.

The feedback path extends from the output of the switch drivers 334, 338, through the level shift low unit 360 and the level shift high unit 364 to the non-overlap module 368. This feedback path prevents the output of the switches 350, 354 from both outputting a high signal level or a low signal level at the same time. The feedback path, the shift units 360 364, and the non-overlap module 368 should be considered as optional.

In one example embodiment, the PMOS switch 350 gate to source voltage VGS may be 0 to ~5 volts with respect to $V_{CC}$, meaning the difference between the $V_{GS}$ high and Vas low will be about 5 volts. When $V_{GS}$ is a low signal level (such as 0 volts), the PMOS switch 350 is OFF and when VGS is 5 volts the PMOS switch 350 is ON. Similarly, the NMOS switch 354 gate to source voltage VGS may be 0 to ~5 volts with respect to $V_{EE}$. When VGS is at a low signal level, such as for example 0 volts, the NMOS switch is OFF and when VGS is a high signal level such as 5 volts, the NMOS switch is ON. The PMOS and NMOS switches 350, 354 produce a high voltage output that swings between $V_{CC}$ and $V_{EE}$, thus achieving the level shift.

For example, in the case of the PMOS switch 350 (high signal level switch) the voltage differential between the source to drain terminal may be quite high, such as 60 volts. Thus, the difference between $V_{EE}$ and $V_{CC}$ may be a large value, such as 60 volts. However, devices 350, 354 will not function if the gate to source voltage is too large. Inherent limitations in semiconductor devices require that the gate voltage be at a voltage that is within an allowed range in relation to the source terminal voltage to avoid device breakdown. The allowable Vas depends on several factors but is typically in the 5 volt range, although this varies with technology and process. This can be referred to as the turn-on voltage of devices in the switching stage. To avoid too high of a voltage $V_{GS}$, the input signal 308 must be shifted upward to establish the difference between the gate voltage and the source voltage to be at an acceptable value in relation to the voltage $V_{CC}$. The shift of the gate voltage based on $V_{CC}$ should not affect the swing of the input signal on input node 308. A similar relationship exists for the low signal level switch 354 and its gate voltage in relation to its source voltage $V_{EE}$.

Figure 4:
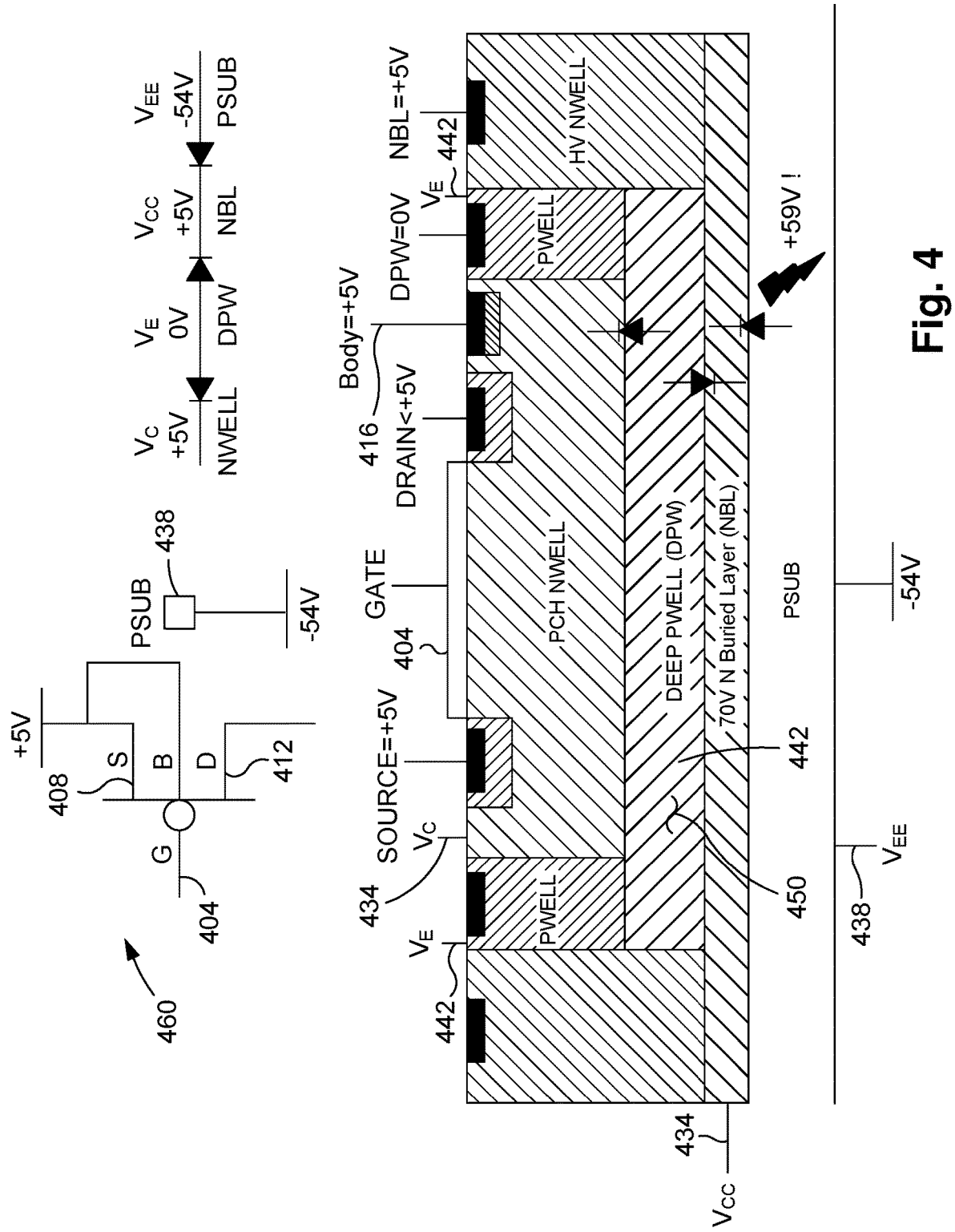
FIG. 4 illustrates an exemplary transistor with an exemplary cutaway side view of a transistor in an isolation well.

FIG. 4 illustrates exemplary mapping of positive and negative supply voltages to a cutaway side view of a transistor in an isolation well. In general, to allow the user or designer to use the disclosed semiconductor in a wide range of applications in which the values for $V_E$, $V_C$, and $V_{EE}$, $V_{CC}$ vary significantly, the circuits are placed in isolation wells. For example, in the embodiments discussed above, while the voltage swings across the FETs may be 5 volts (or some other voltage swing selected by the designer), the offset or shift of the voltage swing may vary between −54 volts to 60 volts. To prevent junction breakdown and avoid device failure, the transistors are fabricated in isolation wells as shown and described in FIG. 4.

In this example embodiment, the illustrated transistor 460 includes a gate terminal 404, a source terminal 408, and a drain terminal 412. The substrate 438 is referred to as PSUB. These elements are also labeled in the cutaway side view. A body 416 of the transistor is connected to the source terminal 408. Exemplary voltage values are provided for discussion only. In this embodiment, the circuit is located in an isolation well formed by the N buried layer NBL 434 (see marked up drawing), which is at a voltage $V_{CC}$, and the deep Pwells DPW 442, which is at voltage $V_E$. The chip substrate 438 is connected to the most negative supply, in this embodiment, $V_{EE}$. The nodes for $V_E$, $V_C$, $V_{EE}$, and $V_{CC}$ can be related to the circuit of FIG. 3.

In reference to FIG. 3 and FIG. 4, the level shift high units 330, 364 and level shift low unit 328, 360 are exemplary devices fabricated in isolation wells, but it is contemplated that all the circuits and elements may be fabricated in isolation wells. The isolation wells protect the device junctions from breaking down due to large potential differences in their voltage in relation to the substrate. As shown, the substrate is connected to the most negative supply, $V_{EE}$, which in this example embodiment is -54 volts. The PMOS device is high voltage and is fabricated without isolation wells. The level shifters 330, 328, 360, 364 use 5V devices that must use isolation to withstand a large PSUB voltage, −54V. Since the substrate could be as low as −54 volts, the low voltage 5V PMOS and 5V NMOS that are connected to $V_{CC}$ could have a large voltage potential difference, for example, +5 volts−(−54 volts) resulting in a difference of 59 volt difference. Without the use of isolation wells, this large voltage differential would lead to device breakdown. The use of wells DPW (Deep P Well) 450, and NBL (N Buried Layer) 434 isolate the low voltage 5V PMOS Nwells 416 from the substrate 438. In this embodiment, the deep PWell 450 and buried layer 434 together can withstand large potential differences up to 70V. In other embodiments, the level shifter may be configured to operate with different voltage levels. The same principles and construction can be applied to the low voltage 5V NMOS devices, such as NMOS devices used in the level shifters 330, 328, 360, 364 shown in FIG. 3. The isolation well structure disclosed in FIG. 4 is but one possible isolation well structure and it is contemplated that other isolation well structures may be utilized without departing from the scope of the invention.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A level shifter configured to accept an input voltage that can float between a switching stage positive supply voltage and a switching stage negative supply voltage thereby allowing a large input voltage range, the level shifter comprising:
   a first stage comprising:
      a first stage input configured to receive an input signal, such that the input signal can float between the positive switching stage supply voltage and a negative switching stage supply voltage, and the input signal voltage swing can swing between a first stage positive supply voltage and a first stage negative supply voltage;
      a buffer configured to shift the input signal to vary between the positive first stage supply voltage and a negative first stage supply voltage to create a buffer output;
      a first stage output configured to present the buffer output as a first stage output signal;
   a switching stage comprising:
      a first switching device configured to process the first stage output signal to generate a high level output signal, the high level output signal ranging between the switching stage positive supply voltage and the switching stage positive supply voltage minus the turn-on voltage;
      a second switching device configured to process the first stage output signal to generate a low level output signal, the low level output signal ranging between switching stage negative supply voltage and the switching stage negative supply voltage plus the turn-on voltage.

2. The level shifter of claim 1 wherein the switching stage positive supply voltage comprises $V_{CC}$.

3. The level shifter of claim 1 wherein the switching stage negative supply voltage comprises $V_{EE}$.

4. The level shifter of claim 1 further comprising one or more switch drivers configured to receive the first stage output signal and generate one or more driver outputs configured to drive one or more switching devices.

5. The level shifter of claim 1 wherein the first stage positive supply voltage is $V_C$ and the first stage negative supply voltage is $V_E$.

6. The level shifter of claim 5 wherein the difference between $V_C$ and $V_E$ is 5 volts.

7. The level shifter of claim 1 wherein the switching stage negative supply voltage is $V_{EE}$ Which is between −54 volts and 0 volts, and the switching stage positive supply voltage is $V_{CC}$ which is between 6 volts and 60 volts.

8. The level shifter of claim 1 wherein the first switching device comprises a PMOS FET and a second switching device comprises a NMOS FET.

9. The level shifter of claim 1 further comprising a non-overlap module configured to prevent the first switching device and a second switching device from being on at the same time.

10. The level shifter of claim 1 wherein the one or more switching devices are in isolation wells.

11. The level shifter of claim 10 wherein the isolation wells are formed by Pwells and Nwells.

12. A level shifter configured to accept an input voltage that can float between a $V_{CC}$ voltage and a $V_{EE}$ voltage thereby allowing a large input voltage range, the level shifter comprising:
   a buffer stage comprising:
      a buffer stage input configured to receive an input signal, the input signal floating between the $V_{CC}$ voltage and the $V_{EE}$ voltage and the input signal swinging between a $V_C$ voltage and a $V_E$ voltage;
      a buffer configured to shift a voltage of the input signal upward or downward, without altering the voltage swing, to create a buffer output;
      a buffer stage output configured to present the buffer output as a first stage output signal;
   a switching stage comprising:
      a first switching device configured to process the first stage output signal to generate a high level output signal, the high level output signal ranging between the $V_{CC}$ voltage and the $V_{CC}$ voltage minus 5 volts;
      a second switching device configured to process the first stage output signal to generate a low level output signal, the low level output signal ranging between $V_{EE}$ voltage and $V_{EE}$ voltage plus 5 volts.

13. The level shifter of claim 12 further comprising one or more switch drivers configured to receive the first stage output signal and generate one or more driver outputs configured to drive one or more switching devices.

14. The level shifter of claim 13 wherein the difference between $V_C$ and $V_E$ is 5 volts.

15. The level shifter of claim 12 wherein the first switching device comprises a PMOS FET and a second switching device comprises a NMOS FET.

16. The level shifter of claim 12 further comprising a non-overlap module configured to prevent the first switching device and a second switching device from being on at the same time.

17. The level shifter of claim 12 wherein the one or more switching devices are in isolation wells.

18. The level shifter of claim 17 wherein the isolation wells are formed by Pwells and Nwells.

19. A method for level shifting an input signal comprising:
   receiving an input signal at a buffer stage such that the received input signal can be between a switching stage positive supply voltage and a switching stage negative supply voltage;
   shifting the input signal voltage, such that the input signal can swing between a buffer stage positive supply voltage and a buffer stage negative supply voltage without altering the total voltage swing, to create a buffer stage output signal;
   outputting the buffer stage output signal to a switching stage;
   processing the buffer stage output signal in the switching stage to generate a high level output signal, the high level output signal ranging between a $V_{CC}$ value and the $V_{CC}$ value minus 5 volts;
   processing the buffer stage output signal in the switching stage to generate a low level output signal, the low level output signal ranging between $V_{EE}$ value and the $V_{EE}$ value plus 5 volts.

20. The method of claim 19 wherein the switching stage negative supply voltage is $V_{EE}$ which is between −54 volts and 0 volts, and the switching stage positive supply voltage is $V_{CC}$ which is between 6 volts and 60 volts.

\* \* \* \* \*